United States Patent
Cho

(10) Patent No.: US 9,337,089 B2
(45) Date of Patent: May 10, 2016

(54) METHOD FOR FABRICATING A SEMICONDUCTOR DEVICE HAVING A BIT LINE CONTACT

(71) Applicant: SK hynix Inc., Gyeonggi-do (KR)

(72) Inventor: Hyun-Shik Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/605,754

(22) Filed: Jan. 26, 2015

(65) Prior Publication Data

US 2015/0132935 A1    May 14, 2015

Related U.S. Application Data

(62) Division of application No. 13/316,827, filed on Dec. 12, 2011, now abandoned.

(30) Foreign Application Priority Data

Jun. 22, 2011 (KR) .................. 10-2011-0060711

(51) Int. Cl.
*H01L 21/4763* (2006.01)
*H01L 21/768* (2006.01)
*H01L 27/108* (2006.01)
*H01L 21/762* (2006.01)
*H01L 21/28* (2006.01)

(52) U.S. Cl.
CPC .... *H01L 21/76877* (2013.01); *H01L 21/28008* (2013.01); *H01L 21/76232* (2013.01); *H01L 27/10876* (2013.01); *H01L 27/10888* (2013.01); *H01L 21/76897* (2013.01)

(58) Field of Classification Search
CPC .................. H01L 21/76877; H01L 21/28008; H01L 21/76897
USPC ............ 257/288, E21.575, E21.577; 438/622
See application file for complete search history.

(56) References Cited

U.S. PATENT DOCUMENTS

| 2009/0068836 A1* | 3/2009 | Kim .................. H01L 21/76816 438/656 |
| 2010/0148236 A1* | 6/2010 | Kadoya ............. H01L 27/10814 257/306 |
| 2012/0025290 A1* | 2/2012 | Takada .............. H01L 21/28273 257/316 |

* cited by examiner

*Primary Examiner* — Robert Huber
(74) *Attorney, Agent, or Firm* — IP & T Group LLP

(57) ABSTRACT

A semiconductor device includes a semiconductor substrate having an active region defined by an isolation layer, a gate line defining a bit line contact region in the active region and extending in one direction, and a dielectric layer covering the semiconductor substrate and the gate line formed in the semiconductor substrate. The semiconductor device is provided with a bit line contact hole formed in the dielectric layer and exposing the bit line contact region. In order to alleviate a self-aligned contact (SAC) fails caused by a conductive material remaining in a contact hole, the semiconductor device contains a bit line contact spaced apart from a sidewall of the bit line contact hole and formed in the bit line contact hole.

13 Claims, 6 Drawing Sheets

METHOD FOR FABRICATING A SEMICONDUCTOR DEVICE HAVING A BIT LINE CONTACT

CROSS-REFERENCE TO RELATED APPLICATIONS

This application is a division of U.S. patent application Ser. No. 13/316,827 filed on Dec. 12, 2011, which claims priority of Korean Patent Application No. 10-2011-0060711, filed on Jun. 22, 2011, which is incorporated herein by reference in its entirety.

BACKGROUND

1. Field

Exemplary embodiments of the present invention relate to a semiconductor device and a method for fabricating the same, and more particularly, to a semiconductor device including a contact, such as a bit line contact, and a method for fabricating the same.

2. Description of the Related Art

As semiconductor devices are highly integrated, a variety of methods for forming a semiconductor device pattern within a limited area may be proposed. Although reducing the critical dimension (CD) of patterns is important when implementing a semiconductor device, forming a stable contact between upper and lower patterns is also important. Accordingly, a self-aligned contact (SAC) formation method that forms a contact using an etching selectivity between layers may be implemented to form a stable contact between upper and lower pattern.

FIG. 1 is a plan view illustrating a conventional semiconductor device and a method for fabricating the same, showing the existing SAC formation method.

Referring to FIG. 1, a bit-line-contact conductive material, such as polysilicon, is buried in a bit line contact hole H, and a bit-line conductive layer (not illustrated) is then formed over the bit-line-contact conductive material.

The bit-line conductive layer is selectively etched to form a bit line BL. The CD of the bit line BL may be set to be smaller than the diameter of the bit-line contact hole H because the CD of the line type may be set to be smaller than the diameter of the hole type through a photolithography process.

Since portions of the bit-line-contact conductive material excluding a portion positioned under the bit line BL may cause a SAC fail during a subsequent process, they are removed during a process of forming the bit line BL. However, the bit-line-contact material in a corner having a small exposure area is not completely removed but remains (refer to a symbol A). The remaining portion of the bit-line-contact material may cause an undesirable coupling to a storage node contact or the like, such as an SAC fail, during a subsequent process.

SUMMARY

An embodiment of the present invention is directed to a semiconductor and a method for fabricating the same, which is capable of preventing an SAC fail caused by a conductive material remaining in a contact hole.

In accordance with an embodiment of the present invention, a semiconductor device includes: a semiconductor substrate including an active region defined by an isolation layer; a gate line defining a bit line contact region in the active region and extending in one direction; a dielectric layer covering the semiconductor substrate and the gate line formed in the semiconductor substrate; a bit line contact hole formed in the dielectric layer and exposing the bit line contact region; and a bit line contact spaced apart from a sidewall of the bit line contact hole and formed in the bit line contact hole.

In accordance with another embodiment of the present invention, a method for fabricating a semiconductor device includes: providing a semiconductor substrate including an active region defined by an isolation layer; forming a gate line defining a bit line contact region in the active region and extending in one direction; forming a dielectric layer over the semiconductor substrate and the gate line formed in the semiconductor substrate; forming a bit line contact hole formed in the dielectric layer and exposing the bit line contact region; forming a spacer on a sidewall of the bit line contact hole; and forming a bit line contact to fill the bit line contact hole including the spacer formed in the bit line contract hole.

DETAILED DESCRIPTION

Figure 1:
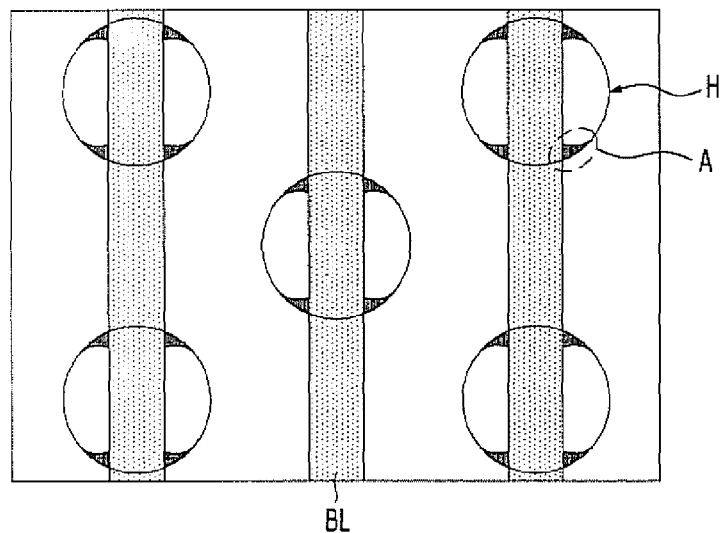
FIG. 1 is a plan view illustrating a conventional semiconductor device and a method for fabricating the same.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
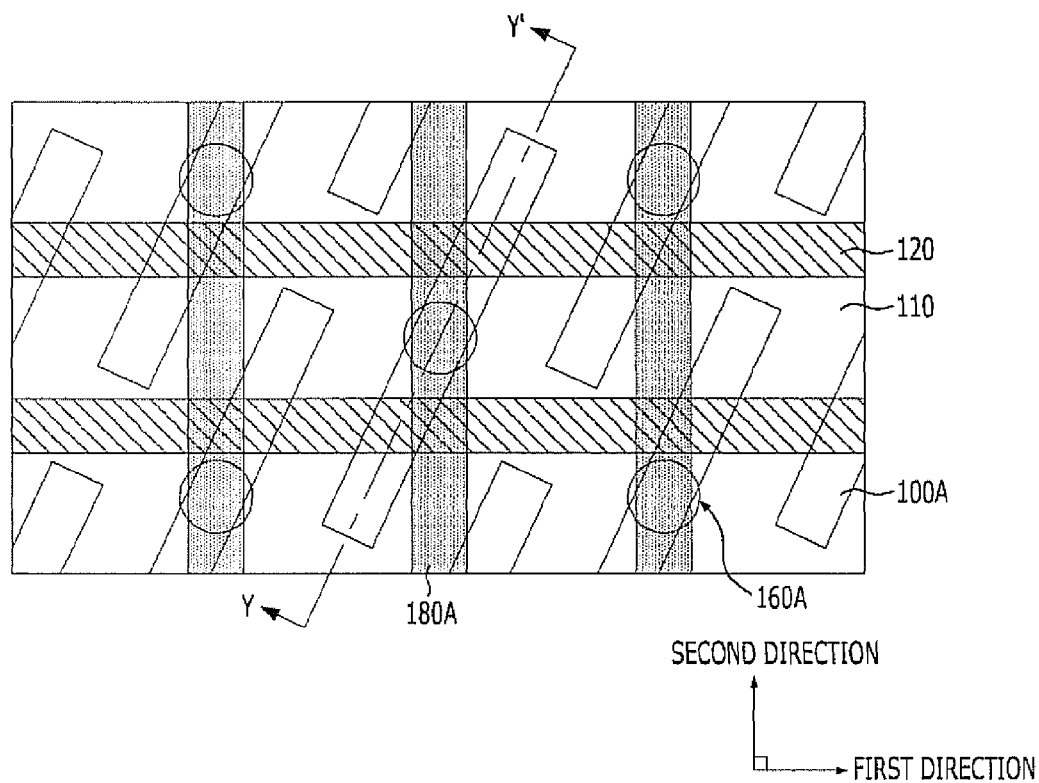
FIG. 2 is a plan view of a semiconductor device in accordance with an embodiment of the present invention.

FIG. 2 is a plan view of a semiconductor device in accordance with an embodiment of the present invention. FIGS. 3A to 3I are cross-sectional views illustrating the semiconductor device and a method of fabricating the same in accordance with the embodiment of the present invention. In particular, FIG. 3I is a cross-sectional view of the semiconductor device in accordance with the embodiment of the present invention, and FIGS. 3A to 3H are cross-sectional views illustrating examples of intermediate processes for fabricating the semiconductor device of FIG. 3I. The cross-sectional views are taken along a line Y-Y' of FIG. 2.

Figure 3A:
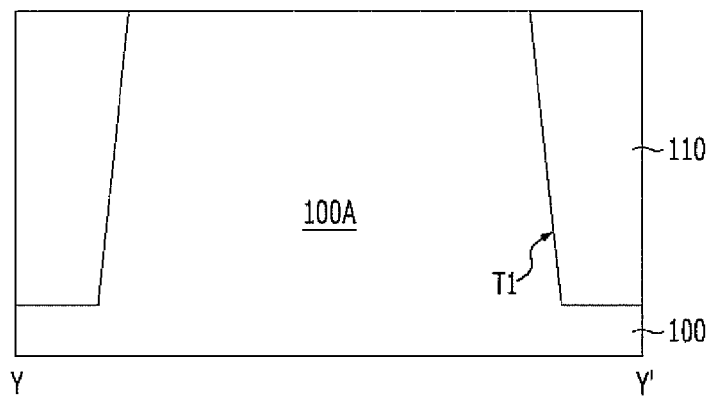
FIGS. 3A to 3I are cross-sectional views illustrating the semiconductor device and a method of fabricating the same in accordance with the embodiment of the present invention.

Referring to FIG. 3A, an isolation layer 110 defining an active region 100A is formed over a semiconductor substrate 100. Before the isolation layer 110 is formed, an ion implantation process may be performed to form the active region 100A in the semiconductor substrate 100.

The isolation layer 110 may be performed through a shallow trench isolation (STI) process. Specifically, the isolation layer 110 may be formed by the following process. First, a hard mask layer (not illustrated) is formed over the semiconductor substrate 100. Subsequently, the hard mask layer is patterned to form a pattern exposing a region where the isolation layer 110 is to be formed, and the semiconductor substrate 100 is etched using the pattern as an etch mask to form an isolation trench T1. The pattern is removed, and the isolation trench T1 is filled with a dielectric layer, such as a spin on dielectric (SOD) layer, to form the isolation layer 110.

The active region 100A is formed in an island shape having a major axis and a minor axis, and the active region 100A is arranged in an oblique direction with respect to a second direction (refer to FIG. 2) in order to increase the integration degree.

Figure 3B:
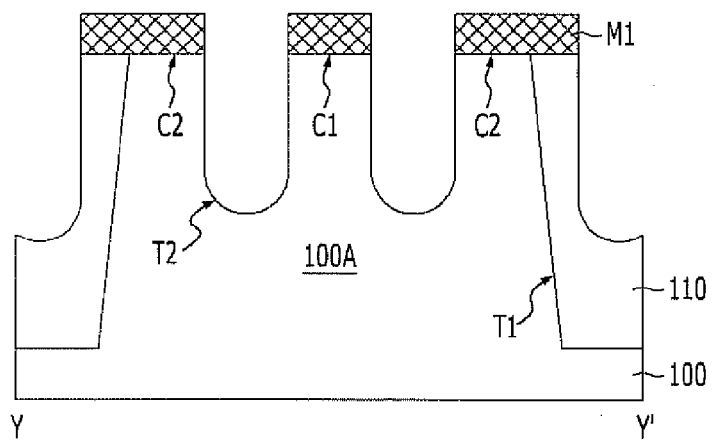

Referring to FIG. 3B, a first hard mask pattern M1 is formed over the semiconductor substrate 100 including the isolation layer 110 to expose a region where a gate line is to be formed. The gate line will be described below in detail. The first hard mask pattern M1 may include an amorphous carbon layer (ALC), silicon oxynitride (SiON), and bottom anti-reflective coating (BARC).

The active region 100A and the isolation layer 110 are etched using the first hard mask pattern M1 as an etch mask to form gate-line trenches T2. Here, two gate-line trenches T2 may be extended in a first direction (refer to FIG. 2) while crossing one active region 100A. The active region 100A between the two gate-line trenches T2 is referred to as a bit line contact region C1, and the active regions 100A on one side of each gate-line trench T2 closest to the isolation layer 110 are referred to as a storage node contact region C2.

Figure 3C:
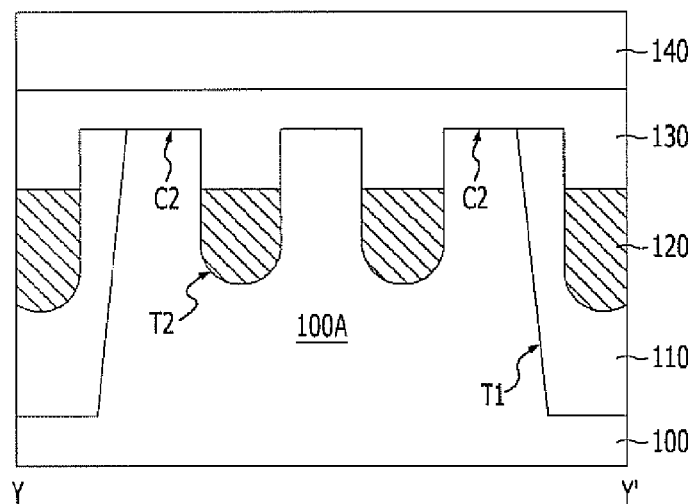

Referring to FIG. 3C, the first hard mask pattern M1 is removed, and a gate dielectric layer (not illustrated) is formed on the surfaces of the gate-line trenches T2, using silicon oxide, for example.

A gate line 120 is formed to fill the gate-line trenches T2 having the gate dielectric layer formed thereon. At this time, the gate line 120 may partially or completely fill the gate-line trenches T2, and may include conductive materials such as titanium nitride (TiN), tungsten (W), and a combination thereof. For example, the gate line 120 may be formed by conformally depositing titanium nitride (TiN) having a large work function and then burying tungsten (W) for reducing resistance in the gate-line trenches T2.

Specifically, the formation of the gate line 120 may be performed by the following process. First, a gate conductive layer (not illustrated) is formed to fill the gate-line trenches T2 having the gate dielectric layer formed thereon. Subsequently, a planarization process, such as chemical mechanical polishing (CMP), is performed until the upper surfaces of the active region 100A and the isolation layer 110 are exposed, and the gate conductive layer is etched to form the buried-type gate line 120. As the gate line 120 is formed with a buried structure, parasitic capacitance between the gate line 120 and a bit line may be reduced while securing a sufficient channel length.

A first dielectric layer 130 and a second dielectric layer 140 are sequentially formed over the resultant structure including the active regions 100A, the isolation layer 110, and the gate lines 120.

The first dielectric layer 130 is a protective layer that covers the upper portion of the gate line 120 and is formed of a material having an etching selectivity with the second dielectric layer 140 to act as an etch stop layer during a subsequent process. For example, the first dielectric layer 130 may be formed by depositing silicon nitride.

The second dielectric layer 140 is a mold layer that forms a spacer, which will be described below, and may be formed by depositing an oxide-based material, such as tetra ethyl ortho silicate (TEOS). Here, the second dielectric layer 140 is formed to a designated thickness.

Figure 3D:
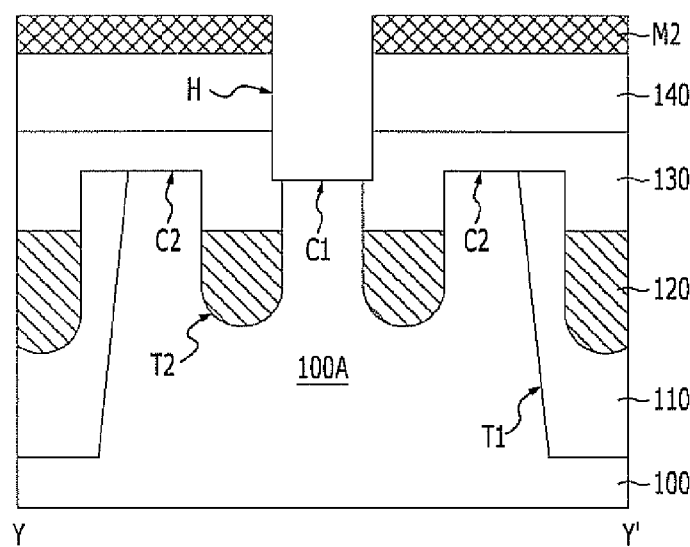

Referring to FIG. 3D, a second hard mask pattern M2 is formed over the second dielectric layer 140 to expose a region where a bit line contact hole H is to be formed. The second hard mask pattern M2 may include an ACL, SiON, BARC, and so on.

The second dielectric layer 140 and the first dielectric layer 130 are etched using the second hard mask pattern M2 as an etch mask to form a bit line contact hole H exposing the bit line contact region C1.

Figure 3E:
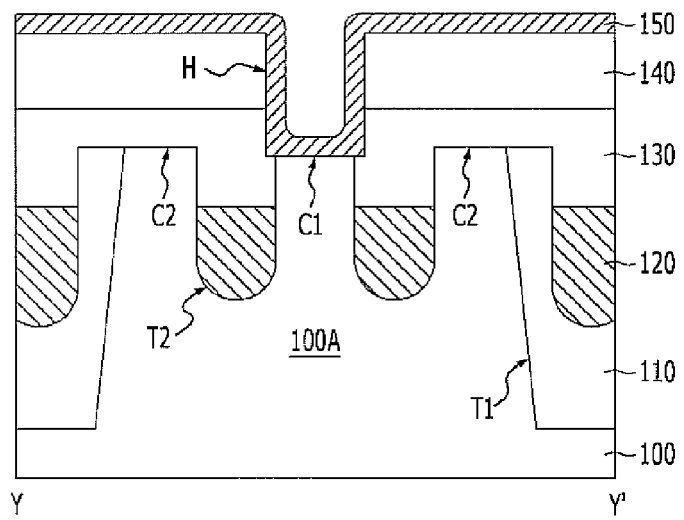

Referring to FIG. 3E, the second hard mask pattern M2 is removed, and a spacer dielectric layer 150 is formed over the resultant structure including the second dielectric layer 140 and the bit line contact hole H. The spacer dielectric layer 150 may be formed by conformally depositing an oxide-based material.

Figure 3F:
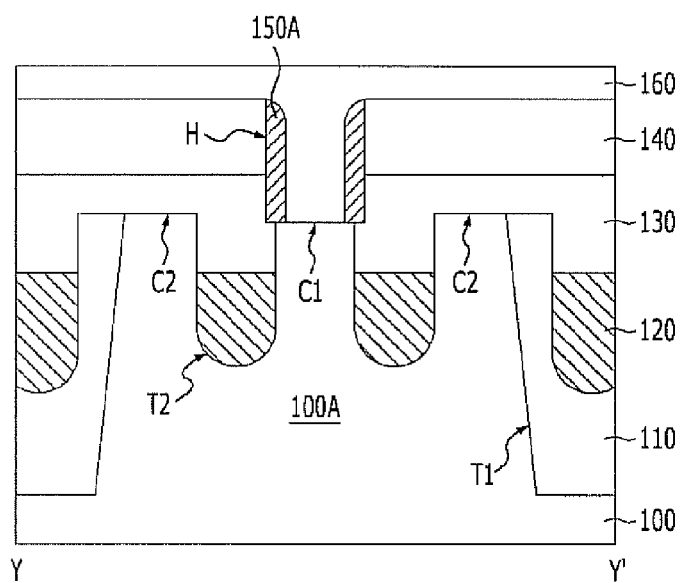

Referring to FIG. 3F, the spacer dielectric layer 150 is partially removed through a blanket etch process so that the spacer dielectric layer 150 remains, for example, only on the sidewall of the bit line contact hole H. Subsequently, a spacer 150A is formed on the sidewalls of the bit line contact hole H.

A bit-line-contact conductive layer 160 is formed to fill the bit line contact hole H having the spacer 150A formed therein. The bit-line-contact conductive layer 160 may be formed by depositing a conductive material such as doped polysilicon.

Figure 3G:
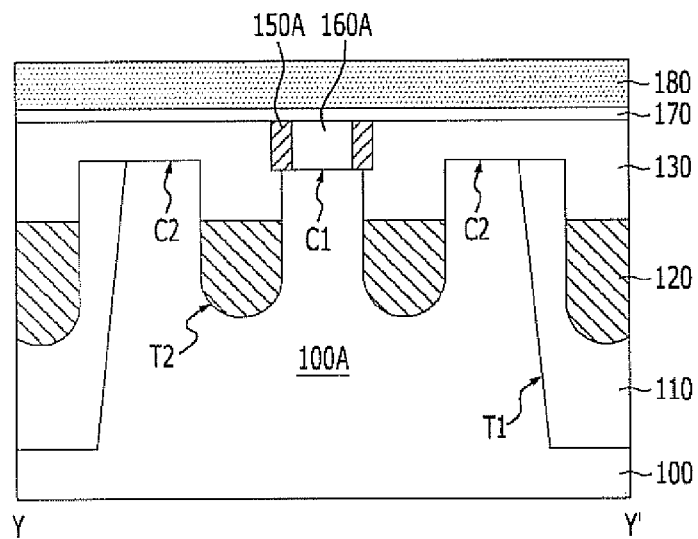

Referring to FIG. 3G, a planarization process is performed until the upper surface of the first dielectric layer 130 is exposed. After the planarization process, a bit line contact 160A is formed. The planarization process may include CMP.

A barrier metal layer 170 and a bit-line conductive layer 180 are sequentially formed over the resultant structure including the bit line contact 160A. The barrier metal layer 170 may include one or more of Ti and TiN, and the bit-line conductive layer 180 may include W.

Figure 3H:
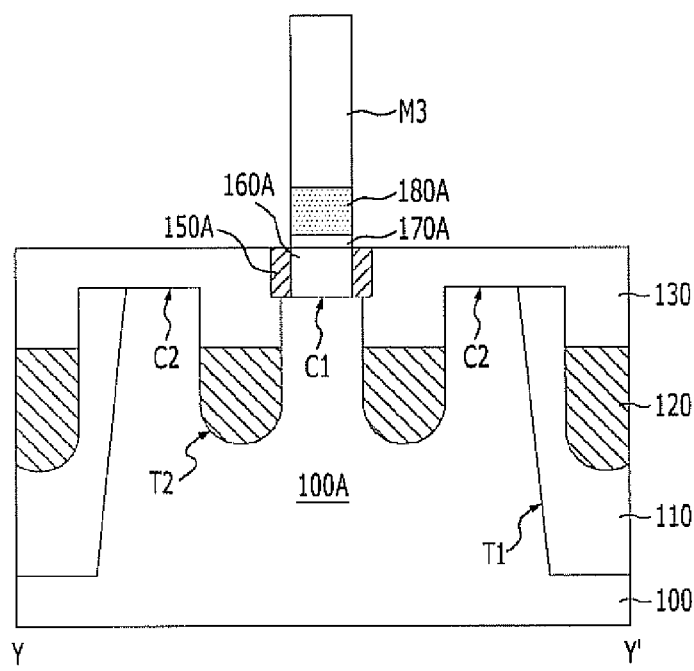
Figure 3I:
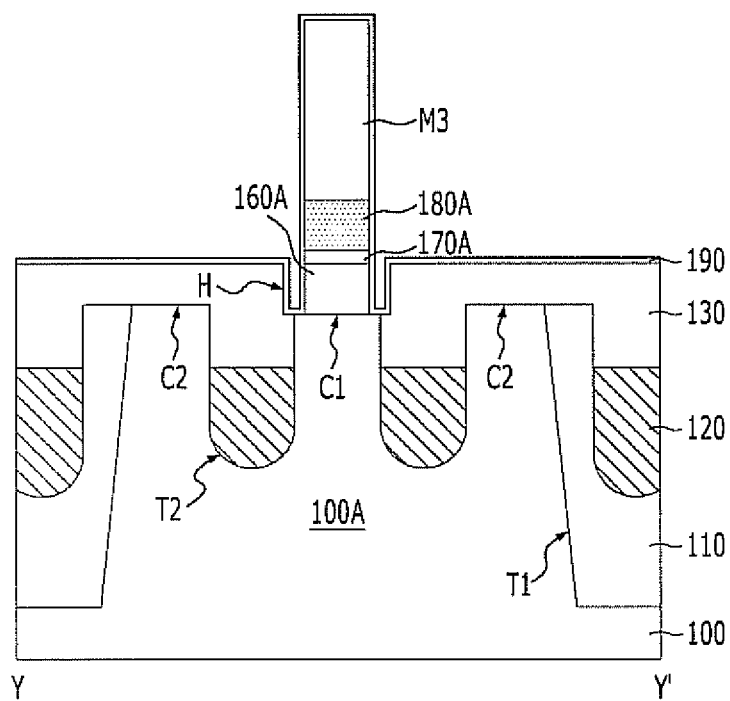

Referring to FIG. 3H, a third hard mask pattern M3 is formed over the bit-line conductive layer 180 to cover a region where a bit line 180A is to be formed. For example, the third hard mask pattern M3 may include silicon nitride and may be extended in a direction crossing the gate line 120.

The bit-line conductive layer 180 and the barrier metal layer 170 are etched using the third hard mask pattern M3 as an etch mask to form a bit line 180A and a barrier metal layer pattern 170A. For illustration purposes, a stacked structure including the barrier metal layer pattern 170A, the bit line 180A, and the third hard mask pattern M3 is referred to as a bit line structure.

Although not illustrated in FIG. 3H, the bit-line conductive layer 180 in a peripheral circuit region may be patterned to form a peripheral circuit gate electrode.

Referring to FIG. 3I, the spacer 150A formed on the sides of the bit line contact 160A is removed. A blanket etch process may be performed to remove the spacer 150A using an etching selectivity between the spacer 150A and the first dielectric layer 130.

A liner layer 190 is formed over the resultant structure including the bit line structure and the first dielectric layer 130. The liner layer 190 serves to prevent a SAC fail, and may be formed by conformally depositing silicon nitride.

Through the above-described method in accordance with the embodiment of the present invention, the semiconductor device as illustrated in FIG. 3I may be fabricated.

Referring to FIGS. 2 and 3I, the semiconductor device in accordance with the embodiment of the present invention may include the semiconductor substrate 100 having the active region 100A defined by the isolation layer 110, the gate line 120 defining the bit line contact region C1 and the storage node contact region C2 in the active region 110A and extending in the first direction, the first dielectric layer 130 covering the semiconductor substrate 100 and the gate line 120, the bit line contact hole H passing through the first dielectric layer 130 and exposing the bit line contact region C1, the bit line contact 160A spaced a designated distance from the sidewall of the bit line contact hole H and formed in the bit line contact hole H, the bit line structure coupled to the bit line contact 160A and extending in the second direction crossing the gate line 120, and the liner layer 190 covering the semiconductor substrate 100 including the bit line structure.

The semiconductor substrate 100 may include a single crystal silicon substrate, and the active region 100A is formed in an island shape having a major axis and a minor axis and arranged in an oblique direction with respect to the second direction in order to increase the integration degree.

The two gate lines 120 divide the active region 100A into three parts, while crossing the active region 100A. Among them, the active region 100A between the two gate lines 120 is referred to as the bit line contact region C1, and the active region 100A in one side of each gate line 120 closest to the isolation layer 110 is referred to as the storage node contact region C2.

The bit line structure includes the barrier metal layer pattern 170A, the bit line 180A, and the third hard mask pattern M3, which are sequentially stacked, and is coupled to the bit line contact region C1 with the bit line contact 160A interposed therebetween. In the semiconductor device, the CD of the bit line 180A is set to be smaller than the diameter of the bit line contact hole H.

In accordance with the embodiment of the present invention, as the spacer is formed to a designated thickness on the sidewalls of the bit line contact hole, the optical limit of the photolithography may be overcome to reduce the size of the bit line contact. Accordingly, the bit-line-contact conductive layer may be prevented from remaining in the corners of the bit line contact hole. Furthermore, as the liner layer is formed over the resultant structure including the bit line structure and the first dielectric layer 130 after the spacer is removed during a subsequent process, an SAC fail may be prevented.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   providing a semiconductor substrate including an active region defined by an isolation layer;
   forming a gate line defining a bit line contact region in the active region and extending in one direction;
   forming a dielectric layer over the semiconductor substrate and the gate line formed in the semiconductor substrate;
   forming a bit line contact hole formed in the dielectric layer and exposing the bit line contact region;
   forming a spacer on a sidewall of the bit line contact hole;
   forming a bit line contact to fill the bit line contact hole including the spacer formed in the bit line contract hole;
   forming a bit line structure coupled to the bit line contact and extending in a direction crossing the gate line; and
   removing the spacer formed on the sidewalls of the bit line contact hole after the forming of a bit line structure.

2. The method of claim 1, further comprising:
   forming a liner layer covering the bit line, the dielectric layer, and exposed regions of the bit line contact hole above the semiconductor substrate.

3. The method of claim 1, wherein the removing of the spacer formed on the sidewalls of the bit line contact hole is performed by a blanket etch process using an etching selectivity between the spacer and the dielectric layer.

4. The method of claim 1, wherein the forming of a gate line defining a bit line contact region in the active region and extending in one direction comprises:
   forming a first hard mask pattern formed over the semiconductor substrate to expose a region where the gate line is to be formed;
   forming a gate-line trench by etching the active region using the first hard mask pattern as an etch mask;
   removing the first hard mask pattern; and
   forming the gate line to at least partially fill the gate-line trench.

5. The method of claim 4, wherein the forming of a gate line defining a bit line contact region in the active region and extending in one direction further comprises:
   forming a gate dielectric layer over the surface of the gate-line trench after the first hard mask pattern is removed.

6. The method of claim 4, wherein the first hard mask pattern includes an amorphous carbon layer (ALC), silicon oxynitride (SiON), and bottom anti-reflective coating (BARC).

7. The method of claim 4, wherein the forming of the gate line to at least partially fill the gate-line trench comprises:
   forming a gate conductive layer to fill the gate-line trench;
   performing a planarization process until the upper surface of the active region is exposed; and
   etching the gate conductive layer to form the buried-type gate line.

8. The method of claim 1, wherein the gate line includes titanium nitride (TiN), tungsten (W), and a combination thereof.

9. The method of claim 1, wherein the forming of a dielectric layer over the semiconductor substrate and the gate line formed in the semiconductor substrate comprises:
   forming a first dielectric layer over a resultant structure including the gate line and the semiconductor substrate to cover the upper portion of the gate line; and
   forming a second dielectric layer over the first dielectric layer, wherein the second dielectric layer is used to form the spacer.

10. The method of claim 9, wherein the first dielectric layer is formed of a material having an etching selectivity with the second dielectric layer.

11. The method of claim 9, wherein the first dielectric layer comprises silicon nitride, and the second dielectric layer comprises an oxide-based material.

12. The method of claim 1, wherein the forming of a spacer on a sidewall of the bit line contact hole comprises:
   forming a spacer dielectric layer over a resultant structure including the bit line contact hole and the dielectric layer; and
   performing a blanket etch process on the spacer dielectric layer so that the spacer dielectric layer remains only on the sidewalls of the bit line contact hole.

13. The method of claim 12, wherein the spacer dielectric layer is formed by conformally depositing an oxide-based material.

* * * * *